(12) United States Patent
Schlörholz et al.

(10) Patent No.: US 7,709,185 B2
(45) Date of Patent: May 4, 2010

(54) METHOD FOR IMAGING A LITHOGRAPHIC PRINTING FORM

(75) Inventors: Mathias Schlörholz, Heidelberg (DE); Harald Latzel, Heidelberg (DE); Bernd Vosseler, Dossenheim (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 14 days.

(21) Appl. No.: 11/728,055

(22) Filed: Mar. 23, 2007

(65) Prior Publication Data
US 2007/0224544 A1    Sep. 27, 2007

(30) Foreign Application Priority Data
Mar. 24, 2006   (DE)  ................ 10 2006 013 753

(51) Int. Cl.
*G03F 7/00* (2006.01)
*G03F 7/04* (2006.01)

(52) U.S. Cl. .................. 430/302; 430/19; 430/401; 101/478

(58) Field of Classification Search ......... 430/270.1, 430/300, 302
See application file for complete search history.

(56) References Cited

U.S. PATENT DOCUMENTS

| | | | |
|---|---|---|---|
| 5,164,000 A * | 11/1992 | Gamblin | ............... 106/2 |
| 6,844,140 B1 | 1/2005 | Wertz et al. | |
| 6,851,366 B2 * | 2/2005 | Gutfleisch et al. | ........... 101/456 |
| 6,919,165 B2 | 7/2005 | Calderon | |
| 6,935,235 B2 * | 8/2005 | Pitz | .................. 101/401.1 |
| 2002/0177053 A1 | 11/2002 | Calderon | |
| 2004/0007146 A1 * | 1/2004 | Gutfleisch et al. | ........ 101/401.1 |
| 2006/0073418 A1 * | 4/2006 | Wilkinson et al. | .......... 430/302 |

FOREIGN PATENT DOCUMENTS

| | | |
|---|---|---|
| DE | 101 21 561 A1 | 11/2002 |
| DE | 102 27 054 A1 | 12/2003 |
| DE | 10 2005 011 192 A1 | 9/2006 |
| JP | 2006-248225 A2 * | 9/2006 |

\* cited by examiner

*Primary Examiner*—Cynthia H Kelly
*Assistant Examiner*—Chanceity N Robinson
(74) *Attorney, Agent, or Firm*—Laurence A. Greenberg; Werner H. Stemer; Ralph E. Locher

(57) ABSTRACT

In a method for imaging a lithographic printing form, subareas of a surface of the lithographic printing form which are covered by amphiphilic molecules, are exposed to electromagnetic radiation. Following the exposure and before printing from the lithographic printing form, the subareas are treated with at least one complex-forming substance, so that a lithographic printing area structured into hydrophilic and hydrophobic regions is obtained.

16 Claims, 4 Drawing Sheets ized metal surface covered by an amphiphilic compound, for example a natively oxidized titanium surface covered by n-octadecane phosphonic acid, is locally selectively exposed to the light beam from a laser, for example an yttrium-doped fiber laser with 3 watt output at 1100 nm wavelength, so that the amphiphilic molecules are removed, hydrophilic regions of the metal surface being exposed.

METHOD FOR IMAGING A LITHOGRAPHIC PRINTING FORM

CROSS-REFERENCE TO RELATED APPLICATION

This application claims the priority, under 35 U.S.C. §119, of German application DE 10 2006 013 753.1, filed Mar. 24, 2006; the prior application is herewith incorporated by reference in its entirety.

BACKGROUND OF THE INVENTION

Field of the Invention

The invention relates to a method for imaging a lithographic printing form, in which subareas of a surface of the lithographic printing form which are covered by amphiphilic molecules are exposed to electromagnetic radiation.

During the imaging of a lithographic printing form which has areas covered by amphiphilic molecules, a high radiation output, in particular laser output, is typically necessary in order that structuring into hydrophilic (damping solution carrying) and hydrophobic (ink accepting) regions is achieved directly by the supply of energy, so that a printing area for lithographic printing is obtained.

In published, non-prosecuted German patent application DE 102 27 054 A1, corresponding to U.S. Pat. No. 6,851,366, reusable or rewritable printing forms for lithographic printing are known which have a printing area with an amphiphilic organic compound, in particular n-octadecane phosphonic acid. The printing area is hydrophobic in the regions in which it is covered by the amphiphilic molecules. In order to perform imaging of the printing area, that is to say to generate a pattern of hydrophilic and hydrophobic regions, a natively oxidized metal surface covered by an amphiphilic compound, for example a natively oxidized titanium surface covered by n-octadecane phosphonic acid, is locally selectively exposed to the light beam from a laser, for example an yttrium-doped fiber laser with 3 watt output at 1100 nm wavelength, so that the amphiphilic molecules are removed, hydrophilic regions of the metal surface being exposed.

The imaging of a lithographic printing form covered by amphiphilic molecules is based on the fact that the laser radiation introduced heats the surface, a change in the layer of the amphiphilic molecules taking place (for example as a result of pyrolysis). The necessity for a high laser output for this procedure results in that commercially obtainable diode laser technology, which is available for imaging conventional printing forms, cannot be used, be it on cost grounds or for technical reasons. In particular, parallel imaging with a plurality of integrated diode lasers, which is advantageously available, cannot be used, so that a relatively high expenditure of time is required for the imaging.

Even the use of lasers of different wavelength, for example 830 nm, the use of different amphiphilic molecules (both various derivatives and various anchor groups) and the optimization of the carrier material, in the, for example, influence on the thermal conductivity, the temperature conductivity or the absorption behavior of light of specific wavelengths, has not led to a significant change in the situation described.

In connection with the regeneration of re-imageable lithographic printing forms covered by amphiphilic molecules, it is known from the published, non-prosecuted German patent application DE 10 2005 020 558 A1 that, before the treatment with an atmospheric pressure plasma, mechanical removal of an outer layer of the printing form surface can be carried out. The mechanical removal can also be carried out with the supplementary use of adjuvants with a chemical or solvent action.

The term lithographic printing form in connection with this description is understood to be a lithographic printing form blank or a lithographic printing form precursor, that is to say also a printing form that is not structured into hydrophilic and hydrophobic regions or is pattern-free.

SUMMARY OF THE INVENTION

It is accordingly an object of the invention to provide a method for imaging a lithographic printing form which overcomes the above-mentioned disadvantages of the prior art methods of this general type, in which structuring of the printing area into hydrophilic and hydrophobic regions can be achieved with a low radiation output, in particular a low power density on the surface to be imaged.

With the foregoing and other objects in view there is provided, in accordance with the invention, a method for imaging a lithographic printing form. The method includes exposing subareas of a surface of the lithographic printing form covered by amphiphilic molecules to electromagnetic radiation, and subsequently treating the subareas with at least one complex-forming substance, resulting in a lithographic printing area structured into hydrophilic and hydrophobic regions being obtained before printing from the lithographic printing form.

In the method according to the invention for imaging a lithographic printing form, in particular a lithographic offset printing form, subareas of a surface of the lithographic printing form covered by the amphiphilic molecules are exposed or subjected to electromagnetic radiation. Following the exposure and before printing from the lithographic printing form, the subareas are treated with at least one complex-forming substance, so that a lithographic printing area structured into hydrophilic, in particular ink-repelling, and hydrophobic, in particular ink-accepting, regions is obtained.

The amphiphilic molecules are in particular amphiphilic organic molecules. It is possible for there to be a plurality of subareas which are not contiguous. The lithographic printing form can in particular be reusable, that is to say repeated imaging into hydrophilic and hydrophobic regions and erasure of the regions is possible, so that different structures (printing subjects) can be produced repeatedly on the printing area. After the treatment and before the treatment with the complex-forming substance, there can still be no structure with hydrophilic and hydrophobic regions on the printing area, or the difference in the level of wetting between the hydrophilic and hydrophobic regions can still not be adequately high for the lithographic printing. The imaging can be described as the impression of a pattern of areas with different wetting properties, the areas with or with many amphiphilic molecules forming image-based regions, and the areas without or with few amphiphilic molecules forming non image-based regions. The imaging can be designated negative imaging in as much as the non image-based regions are selected and processed in the imaging method. During the treatment of the subareas, the regions of the surface not exposed to the electromagnetic radiation can also come into contact with the complex-forming substance but it being possible for interactions possibly occurring with the amphiphilic molecules or with the surface in these regions having no effects on the result according to the invention. The treatment can in particular be smearing, spraying, wetting. The structuring can be carried out in accordance with a printing subject to be printed, in particular a color separation of a print job to be printed.

In connection with this description, the term "covered" is to be understood to mean that the surface has a layer, in particular a molecular layer, a monomolecular layer or a nanolayer, of the amphiphilic molecules. The amphiphilic molecules can be adsorbed on the surface. The amphiphilic molecules can be in particular adsorbed on the surface, held on or bound to the surface via a hydrophilic molecular region, an anchor group. The amphiphilic molecules can be molecules which are able to form self-assembling monolayers (SAM). The amphiphilic molecules can have a surfactant-like structure.

In the case of imaging according to the invention, the structuring is achieved by the action of the complex-forming substance on the subregions of the surface previously exposed to electromagnetic radiation. Since the complex-forming substance acts as a solvent-promoting action or as a solvent, as compared with imaging with only the action of electromagnetic radiation in order to remove amphiphilic molecules, according to the invention an advantageously lower radiation output, in particular a lower output power, of the radiation-producing device, is required. In this way, in particular commercially available, multichannel radiation-producing devices can be used, for example individually controllable laser diode bars, as are used in the SUPRASETTER printing form exposer from Heidelberger Druckmaschinen AG.

In the method according to the invention for imaging a lithographic printing form, by the action of the complex-forming substance, in particular in the irradiated regions, the density of the amphiphilic molecules in the subareas is reduced and/or amphiphilic molecules are removed from the subareas and/or masked chemically in the subareas. In other words, according to the invention a selective reduction, removal or chemical masking of the amphiphilic molecules can be achieved in subareas of the surface which were previously exposed to electromagnetic radiation, so that a pattern of hydrophilic (with adequately few effective amphiphilic molecules) and hydrophobic (with adequately many effective amphiphilic molecules) regions is produced as a printing area on the printing form.

In the method according to the invention, during the exposure on the surface, a flux of less than or equal to 2 $J/cm^2$, preferably of less than or equal to 1.6 $J/cm^2$, and/or less than 1000 $kW/cm^2$, preferably less than 700 $kW/cm^2$ output is preferably introduced. In particular, in the method according to the invention, imaging can be carried out by one or more lasers having an output of less than 1 watt, in particular less than 500 mW with a spot size of about 10 micrometers diameter ($1/e^2$ drop). The exposure can be carried out with an imaging speed of 2.5 m/s.

In connection with this description, "complex-forming substance" is to be understood to be a substance which is able to form molecular compounds or atomic compounds with one or more central molecules or central atoms or central ions (central particles), in which, by forming a (not necessarily complete) molecular sheath or molecular matrix around the central particle or particles, specific physical or chemical properties of the complexed central particles are at least partly, preferably wholly, suppressed. The central particle is in this way likewise partly or wholly masked. This is able to effect, for example, a change in the solubility of the central particles and therefore a change in the mobility of the central particles in a given solvent. The complex-forming substance can also itself occur in a different connection as a solvent or a solvent-promoting substance for a given solvent. In short, a complex-forming substance encloses a central particle and changes its chemical properties.

In practical embodiments of the method according to the invention, the complex-forming substance can be a polar medium or be dissolved in a polar medium, in particular in water. The complex-forming substance can be designated a developer solution.

In the method according to the invention, the molecules of the complex-forming substance are preferably ligands, which are able to enter into one or more coordinative bonds with the amphiphilic molecules and/or fragments of the amphiphilic molecules, in particular fragments of the amphiphilic molecules formed by photo-dissociation.

In connection with this description, "ligand" is to be understood to be a complex-forming substance which is able to enter into a bond or interaction with one or more central molecules or central atoms or central ions (central particles), so that, under specific preconditions (for example at a specific pH or in a specific solvate system), a bound molecular compound or bound atomic compound (complex) can be formed. The complex forms new or changed physical or chemical properties. In the complex, one or more ligands can be arranged around one or more suitable central particles. In this case, the bond does not necessarily have to be a chemical bond with a covalent character. Complex bonds can be multi-bonded or multiple, that is to say the ligands do not form just one but a plurality of bonds with the complexed central particle. Furthermore, a plurality of ligands can also simultaneously form one or more bonds with one and the same central particle. The individual bonds or interactions arising in this way are generally weaker than covalent bonds. In short, a ligand bonds coordinatively with a central particle.

In a preferred embodiment of the method according to the invention, the complex-forming substance is a complex-forming oligosaccharide or a complex-forming polysaccharide. An oligosaccharide contains up to 100 monosaccharides, while a polysaccharide has more than 100 monosaccharides. The saccharide can be an aldose (polyhydroxyaldehyde) or a ketose (polyhydroxyketone). In particular, the complex-forming substance can be gum arabic. For instance, gum arabic is marketed by the company Eggen-Chemie GmbH & Co. KG, 31157 Sarstedt, Germany, under the designations AgumO and AgumZ.

In an alternative preferred embodiment of the method according to the invention, the complex-forming substance is ammonia or citric acid or a mixture of ammonia and citric acid, in particular dissolved in water.

In a development of the method according to the invention, the subareas are subjected to a weak acid, in particular a non-oxidizing acid, during the treatment with the complex-forming substance.

In the method according to the invention, the electromagnetic radiation is preferably infrared laser radiation. The infrared laser radiation is preferably produced by one or more solid body lasers or semiconductor lasers, in particular diode lasers.

Furthermore or alternatively to this, in the method according to the invention the surface that can be covered by amphiphilic molecules preferably has natively oxidized titanium, aluminum, steel, zirconium, magnesium or mixtures of these metals or titanate or zirconate.

Furthermore or alternatively to this, in the method according to the invention the amphiphilic molecule can be an inorganic or organic acid substituted with an aliphatic or aromatic radical. In particular, the amphiphilic molecule can be a hydroxamic acid or a carbonic acid or a phosphonic acid.

Furthermore, in particular the radical can have an unsubstituted or substituted carbon chain, the number of carbon atoms being greater than or equal to 6, preferably greater than or equal to 8, in particular greater than or equal to 12 and less than or equal to 25.

To those skilled in the art to whom this description is directed, it is clear that the lithographic printing form can be a printing form as has been disclosed in the published, non-prosecuted German patent application DE 102 27 054 A1, corresponding to U.S. Pat. No. 6,851,366. The entire disclosure content of published, non-prosecuted German patent application DE 102 27 054 A1 and U.S. Pat. No. 6,851,366 are incorporated by reference herein in the disclosure content of this description.

Other features which are considered as characteristic for the invention are set forth in the appended claims.

Although the invention is illustrated and described herein as embodied in a method for imaging a lithographic printing form, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
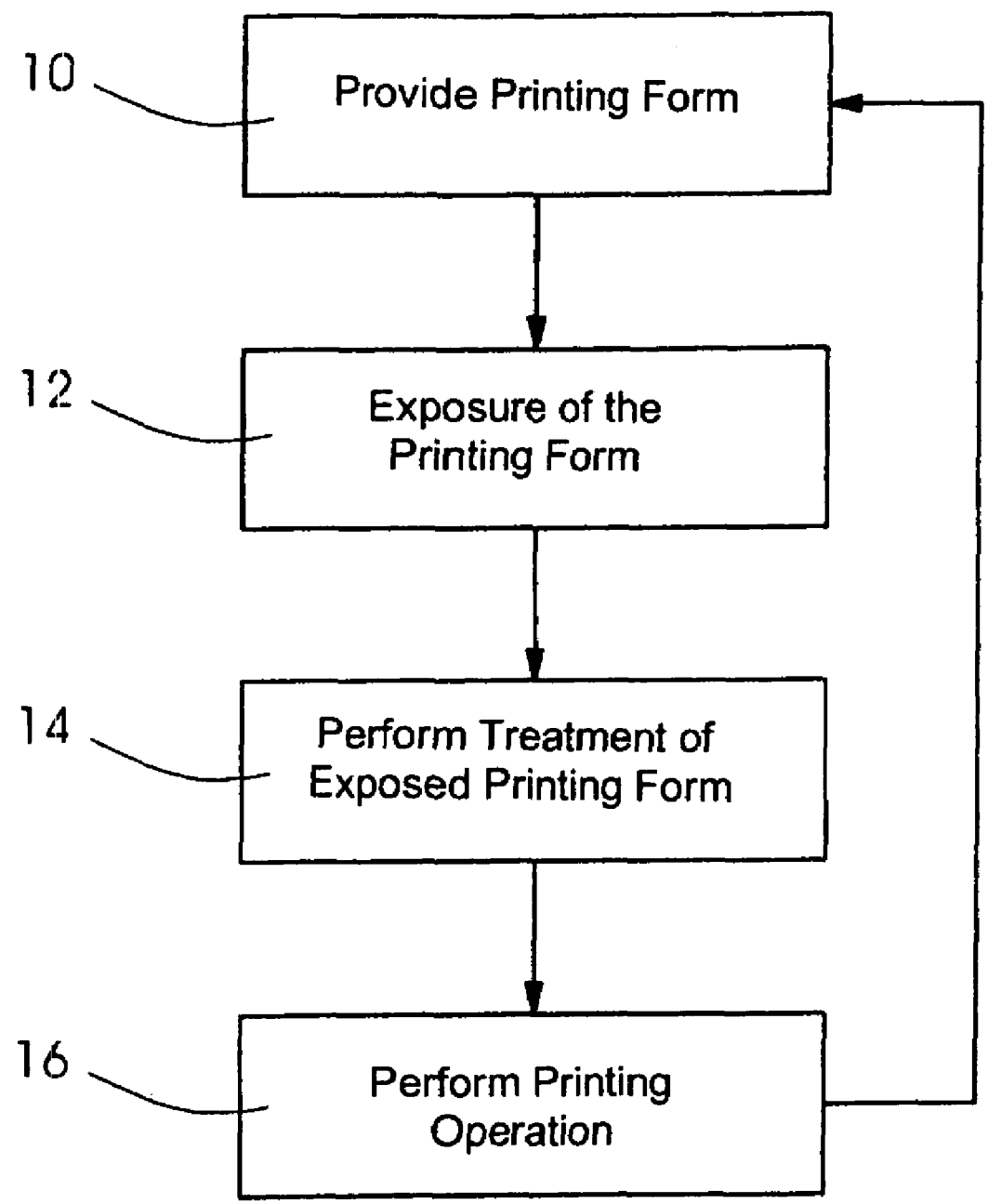
FIG. 1 is a flow chart of a preferred embodiment of the method according to the invention.

Referring now to the figures of the drawing in detail and first, particularly, to FIG. 1 thereof, there is shown a flow chart of a preferred embodiment of the method according to the invention. For a lithographic printing process, in particular an offset printing process, a surface having a layer, in particular a microscopic layer, for example a monolayer, of amphiphilic molecules is provided in step 10. The part of the surface which subsequently represents a printing area is initially unstructured, that is to say substantially homogeneous and densely covered by amphiphilic molecules. As a result of the covering, because of the hydrophobic side of the amphiphilic molecules facing away from the surface, the printing area is substantially homogeneously hydrophobic (in this regard, see also FIG. 2). This initial state can be reproduced repeatedly, so that the method described below can be applied repeatedly for various structure patterns (printing subjects). More details relating to providing a printing form having amphiphilic molecules can be gathered from published, non-prosecuted German application DE 102 27 054 A1, corresponding to U.S. Pat. No. 6,851,366, already mentioned and incorporated by reference herein. In this preferred embodiment, the surface is a natively oxidized titanium surface, and the amphiphilic molecules used are phosphonic acids.

According to the invention, in the imaging method, an exposure 12 of the printing form covered by amphiphilic molecules to electromagnetic radiation, to laser radiation in this embodiment, is carried out. The exposure 12 is carried out selectively, that is to say only in subregions of the surface, in a (two-dimensional) pattern on the basis of a printing subject to be printed, in particular of a color separation to be printed. In this case, the surface, more accurately the amphiphilic molecules, are exposed only to such a low laser output, for example lasers having only a few hundred milliwatts, preferably 100 to 300 milliwatts, output power are used, that only small changes in the layer of amphiphilic molecules occur (in this regard, see also FIGS. 3A-3C). After this there is no adequately large contact angle difference (measure of the hydrophilicity or hydrophobicity) between the exposed regions and the non-exposed regions for the lithographic printing.

Only the treatment 14 with a complex-forming substance following the exposure 12 has the effect that the layer of amphiphilic molecules changed by the laser radiation in subregions of the surface is changed to a great extent in such a way that an adequately large contact angle difference is achieved. In this preferred embodiment, the complex-forming substance is gum arabic, alternatively to this a unimolar aqueous solution of citric acid, ammonia or a mixture of these two substances. In other words, by the complex-forming substance, as a developer or a developer solution, the structure present after the exposure 12 and having an inadequately sharp wetting difference becomes an adequately sharp structure. It is clear to those skilled in the art that the treatment 14 is not necessary to the extent that the amphiphilic molecules have already been removed completely by the exposure 12. It is also clear to those skilled in the art that the treatment 14 as such is not sufficient to achieve selective removal of amphiphilic molecules from subareas of the surface. In non-exposed regions, that is to say regions not influenced by the electromagnetic radiation, the amphiphilic molecules are bound too highly in the layer to be removable by an exclusive action of the complex-forming substance.

In this manner according to the invention, a printing area structured into hydrophilic and hydrophobic regions is obtained. The printing 16 from the lithographic printing form can be carried out in a conventional way. After that, possibly following cleaning, renewed provision 10 of the printing form can be carried out. In other words, the structure or the pattern of the hydrophilic and hydrophobic regions is removed or erased and the surface is changed into the unstructured initial state.

Figure 2:
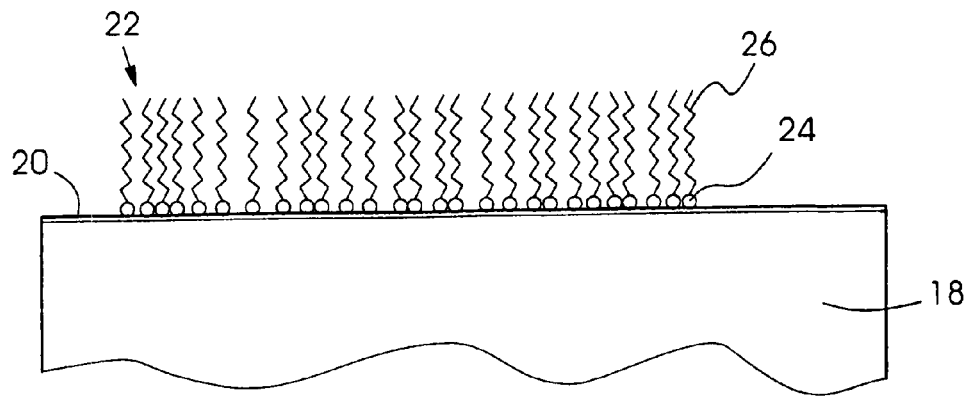
FIG. 2 is a schematic microscopic illustration of an embodiment of a surface of a lithographic printing form which is covered by amphiphilic molecules and which can be imaged with the method according to the invention.

The preferred embodiment of a lithographic printing form 18, in particular a metallic printing form, illustrated schematically in FIG. 2, has a hydrophilic surface 20 (for example on account of native oxidation) which is covered by amphiphilic molecules 22. The amphiphilic molecules 22 preferably form a self-assembling monolayer, but a multiple layer containing a plurality of layers of amphiphilic molecules 22 can also be present on the lithographic printing form 18. The amphiphilic molecules 22 have hydrophilic anchor groups 24 and hydrophobic organic chains 26. An amphiphilic molecule 22 can be bound to the surface 20 by the hydrophobic anchor group 24, for example adsorbed. The amphiphilic molecules 22 are preferably oriented in such a way that the organic chains 26 face vertically away from the surface. For the functionality of the layer of amphiphilic molecules 22 as a hydrophobic subarea of the printing area, however, this orientation is not absolutely necessary.

Figure 3A:
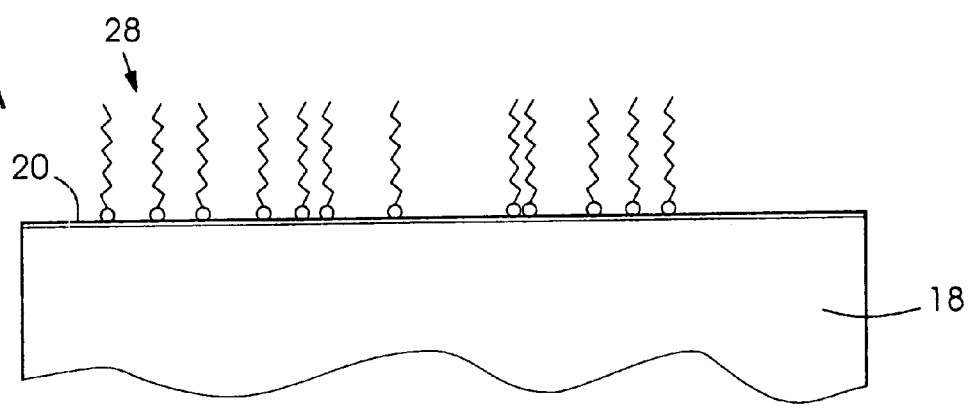
FIGS. 3A-3C are schematic microscopic illustrations of the surface covered by amphiphilic molecules after exposure to electromagnetic radiation.
Figure 3B:
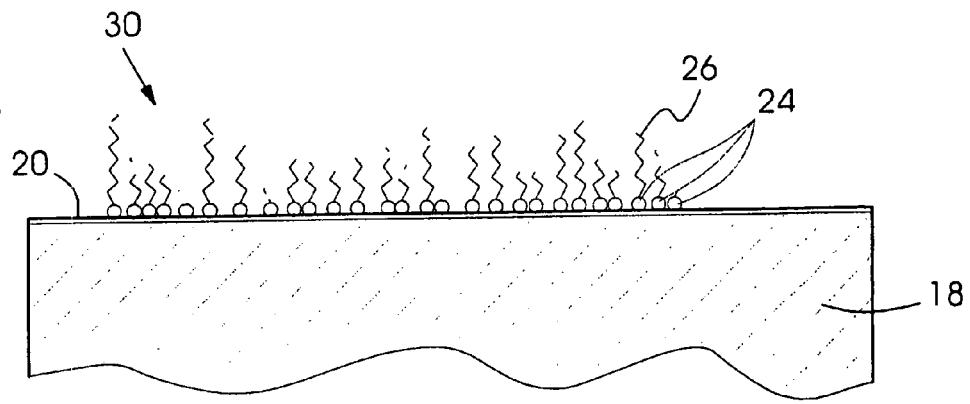
Figure 3C:
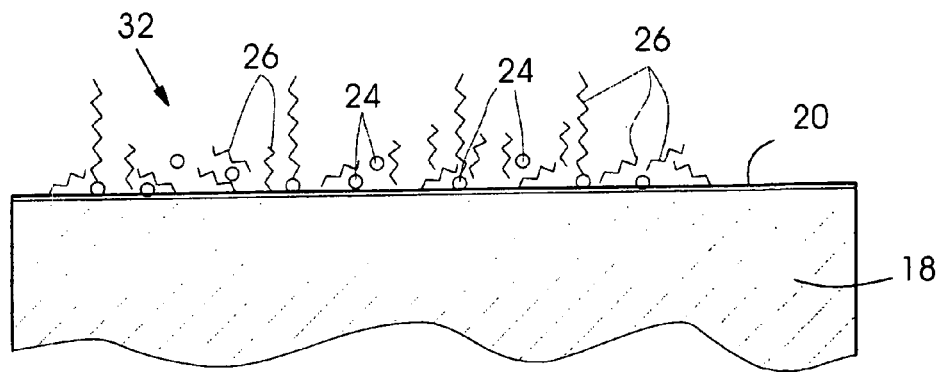

FIGS. 3A-3C show the microscopic illustrations of the surface covered by amphiphilic molecules after exposure with electromagnetic radiation. Following the exposure of a surface covered by amphiphilic molecules, the amphiphilic molecules can be removed completely, incompletely or not at all. In particular, in the case of incomplete removal, the amphiphilic molecules can have been damaged by the electromagnetic radiation. In addition, the orientation of the amphiphilic molecules can be changed or the organization of the arrangement can be reduced.

In FIG. 3A, the lithographic printing form 18 is shown with an etiolated layer of amphiphilic molecules. In other words, with the aid of the electromagnetic radiation acting, some of the amphiphilic molecules have been removed completely, in particular including the anchor group. In this way, the hydrophobicity of this region of the surface can be reduced. However, it is possible for the difference in the hydrophobicity between exposed and non-exposed regions to be inadequate to carry out a lithographic printing process.

In FIG. 3B, a layer 30 of amphiphilic molecules having partly destroyed chains 26 is shown on the surface 20 of the lithographic printing form 18. The anchor groups 24 are still bound to the surface, while the hydrophobic chains have been partly destroyed or removed by the action of electromagnetic radiation. In this situation, too, the hydrophobicity is reduced, the hydrophilic anchor groups are at least partly accessible from outside, the side facing away from the surface, and exhibit relatively great interaction with respect to polar media, for example a damping solution in a lithographic printing process.

In FIG. 3C, a layer 32 of amphiphilic molecules with partly loosened anchor groups 24 can be seen on the surface 20 of the lithographic printing form 18. The anchor groups 24 have been loosened wholly or partly from the surface 20, the waste compounds, predominantly hydrophobic molecular fragments, have been deposited on the surface 20 and prevent a hydrophilic wetting property. When loosening the amphiphilic molecules, including the anchor groups 24 thereof, it is additionally possible for individual atoms or ions of the metal matrix of the lithographic printing form 18 to be removed with the amphiphilic molecules.

The situation shown in FIGS. 3A-3C can also occur jointly with one another, combined or mixed in an exposed subregion of the surface.

The treatment of the surface exposed to electromagnetic radiation in subareas, the development step, has the aim of achieving a level of hydrophilicity that is adequate for the lithographic printing process, an adequate wetting difference in relation to non-exposed regions, at the exposed points or regions, without reducing or restricting the ink carrying, the hydrophobicity of the non-exposed regions.

Figure 4:
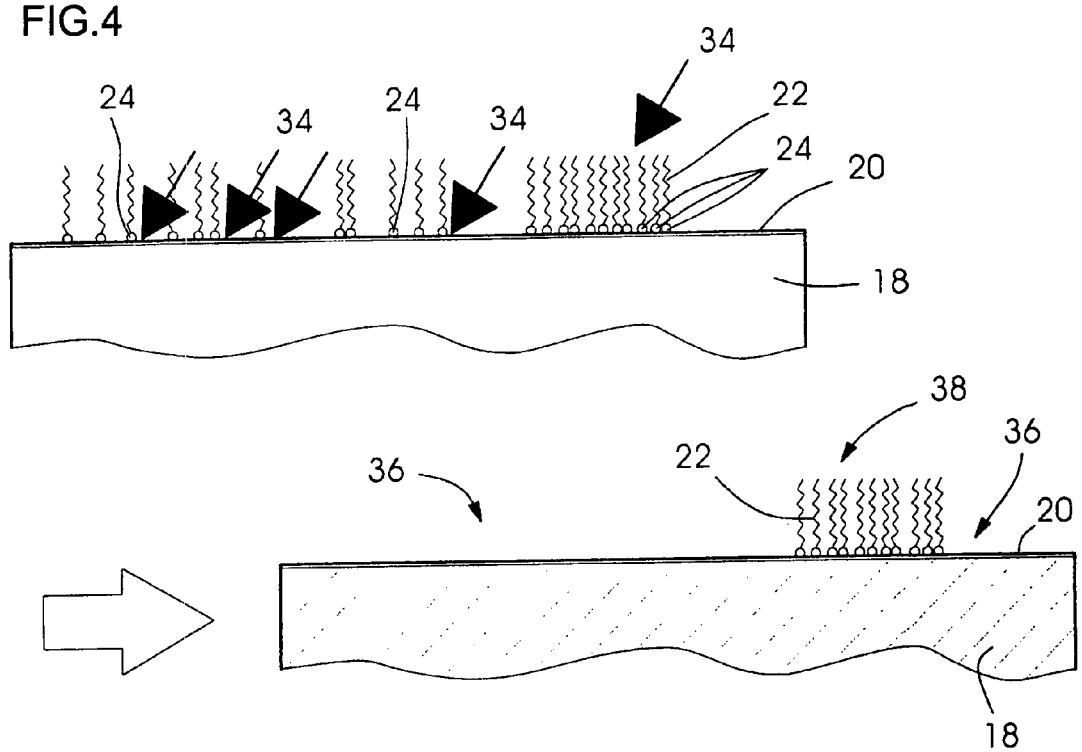
FIG. 4 is a schematic microscopic illustration of the treatment with a complex-forming substance of the surface covered by the amphiphilic molecules in the situation shown in FIG. 3A.

In FIG. 4, a schematic microscopic illustration of the treatment with a complex-forming substance of the surface covered by amphiphilic molecules in the situation shown in FIG. 3A can be seen. On account of the etiolation of the amphiphilic molecules 22, the anchor groups 24 are chemically accessible as a result of diffusion of the complex-forming substance into the layer of amphiphilic molecules. In particular, the formation of interactions with a polar medium is possible. An action 34 of the complex-forming substance is illustrated by the arrows shown in FIG. 4. In this way, the bonds of the anchor groups to the (natively oxidized) metallic surface 20 of the lithographic printing form 18 are broken by chemical reaction, for example by hydrolysis. In the case of a tightly closed layer of amphiphilic molecules 22, on the other hand, it is not possible for a polar substance, in particular a polar medium, to reach the anchor groups 24 of the amphiphilic molecules 22 sterically or physically and to break the bonds thereof to the surface 20. Furthermore, a chemically acting complex-forming substance, a developer solution, is then able partially to wet the regions exposed to electromagnetic radiation, on account of the reduced hydrophobicity of the etiolated layer, and there to remove the amphiphilic molecules weakened in terms of their bonding to the surface 20. The weakening of the bonding is in this case also produced merely by defects, that is to say by reducing the organization in the layer of amphiphilic molecules, which results in that this layer loses its mechanical robustness. The hydrophilicity, in other words the difference in the wettability with ink and water, respectively, of imaged and non-imaged regions, is thus increased further in these regions on account of a combination of solvolysis and mechanical processes, so that it is adequate for the lithographic printing process.

In the lower part of FIG. 4, the result of the treatment of the lithographic printing form 18 with a complex-forming substance is shown. The surface 20 has hydrophilic regions 36 and hydrophobic regions 38, in which there is still a dense layer of amphiphilic molecules 22. The surface is structured on the basis of an image or subject or pattern.

Figure 5:
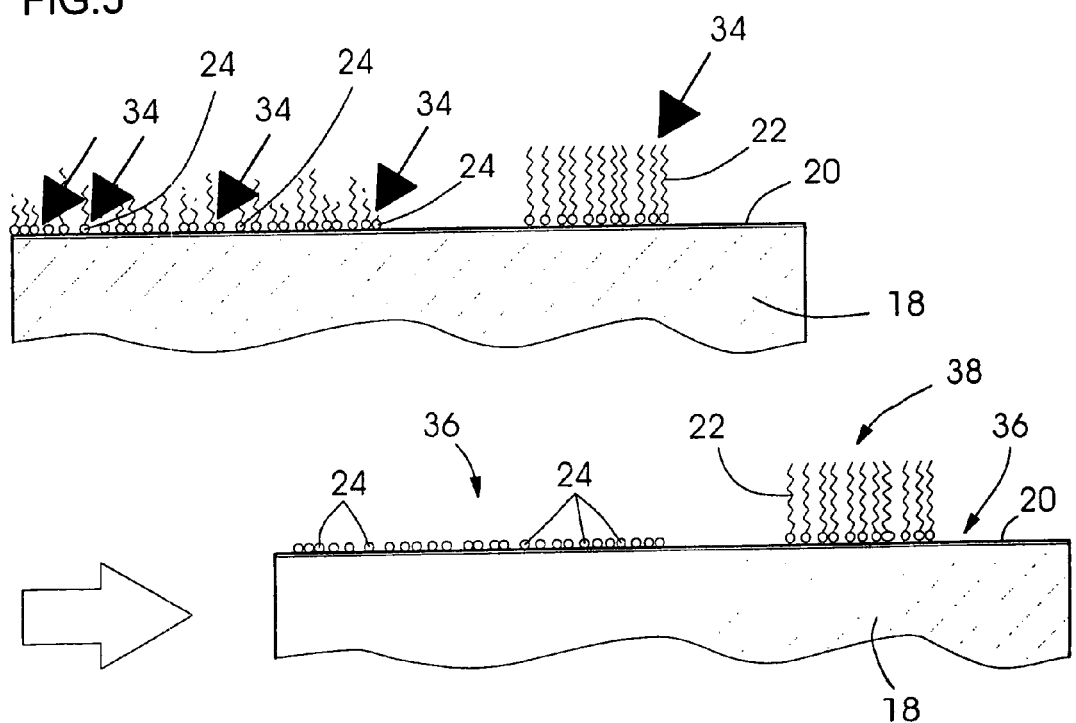
FIG. 5 is a schematic microscopic illustration of the treatment with the complex-forming substance of the surface covered by the amphiphilic molecules in the situation shown in FIG. 3B and the result of the application.

FIG. 5 shows, schematically, the treatment with a complex-forming substance of the surface 20 of the lithographic printing form 18 covered by amphiphilic molecules in the situation shown in FIG. 3B and the result of the application. The anchor groups 24 of the destroyed amphiphilic molecules 22, which have remained to some extent, are wetted by the polar medium, in particular the complex-forming substance, are possibly loosened and removed. In this case, the dissolution of a complex compound of the anchor group 24 with metal atoms or metal ions of the surface 20 is also possible. The removal of the remaining (undestroyed) etiolated amphiphilic molecules can be seen in the manner analogous to the processes described in relation to FIG. 4. An increase in the hydrophilicity is even provided when the remaining polar anchor groups 24 have not been removed, as illustrated schematically in the lower part of FIG. 5. The surface 20 has the hydrophilic regions 36, in which there are still individual hydrophilic anchor groups 24, and the hydrophobic regions 38, in which there is still a dense layer of amphiphilic molecules 22. The surface is structured on the basis of an image or subject or pattern.

Figure 6:
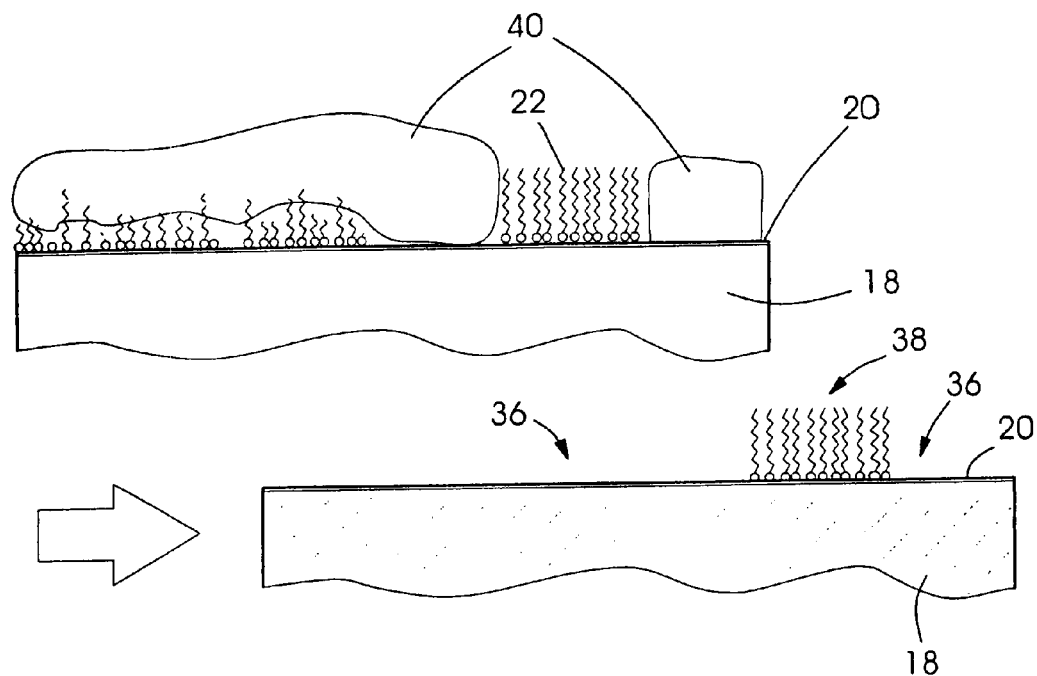
FIG. 6 is a schematic microscopic illustration of the treatment with an alternative complex-forming substance of the surface covered by the amphiphilic molecules in the situation shown in FIG. 3B and the result of the application as an alternative to the situation shown in FIG. 5.

FIG. 6 is based on the treatment with an alternative complex-forming substance in a polar medium 40 of the surface 20 of the lithographic printing form 18 covered by amphiphilic molecules in the situation shown in FIG. 3B and the result of the application as an alternative to the situation shown in FIG. 5. The anchor groups 24 of the destroyed amphiphilic molecules 22, which have remained to some extent, are wetted by the polar medium with the complex-forming substance, are possibly loosened and removed. In this case, the dissolution of a complex compound of the anchor group 24 with metal atoms or metal ions of the surface 20 is also possible. The removal of the remaining (undestroyed) etiolated amphiphilic molecules can be seen in the manner analogous to the processes described in relation to FIG. 4. A considerable increase in the hydrophilicity is then provided even when the remaining polar anchor groups 24 are removed as well, as illustrated schematically in the lower part of FIG. 6. The surface 20 has the hydrophilic regions 36, which are free from amphiphilic molecules or radicals thereof, and the hydrophobic regions 38, in which there is still a dense layer of amphiphilic molecules 22. The surface is structured on the basis of an image or subject or pattern.

Figure 7:
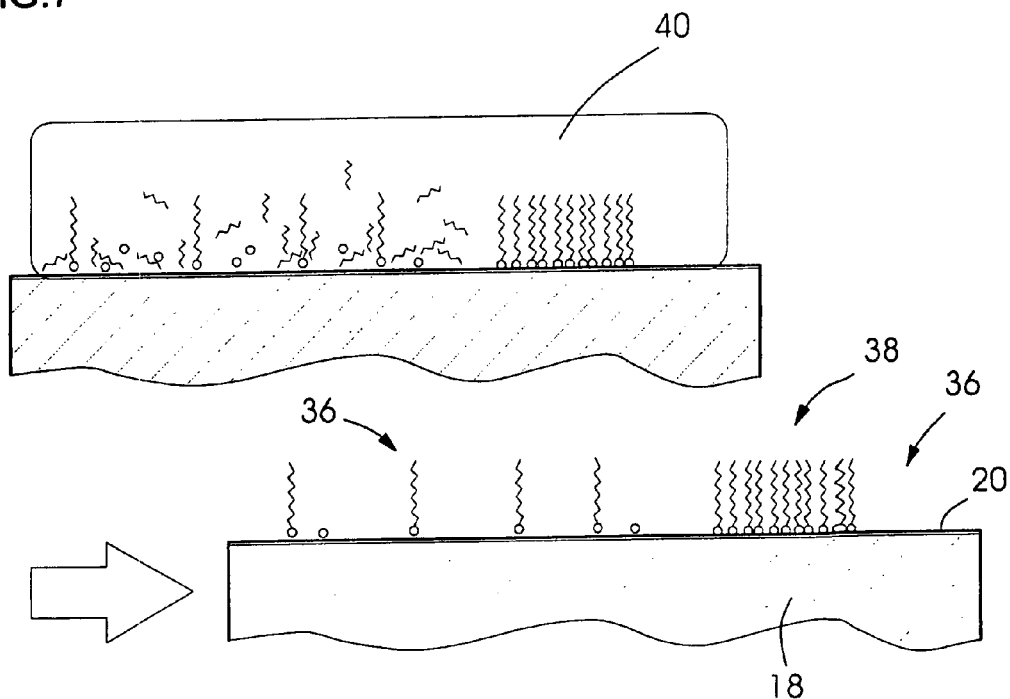
FIG. 7 is a schematic microscopic illustration of the treatment with a complex-forming substance of the surface covered by the amphiphilic molecules in the situation shown in FIG. 3C.

FIG. 7 is a schematic microscopic illustration of the treatment with a complex-forming substance in a polar medium 40 of the surface covered by amphiphilic molecules in the situation shown in FIG. 3C. The waste products have to be removed from the surface 20 mechanically or in a dissolving process. As illustrated schematically in the lower part of the FIG. 7, the surface 20 contains the hydrophilic regions 36, which still have individual etiolated amphiphilic molecules or anchor groups bound to the surface 20, and the hydrophobic regions 38, in which there is still a dense layer of amphiphilic molecules 22. The surface is structured on the basis of an image or subject or pattern.

Expressed in other words, the complex-forming substances or developer solutions used are (polar) substances, in particular media which increase the solubility of metal ions and/or which weaken or break up bonds formed in the layer of amphiphilic molecules (complex or covalent bonds, in particular condensed bonds) to the surface, for example by displacing the bonding equilibrium of the complexed particles or by the hydrolysis of covalent, in particular condensed, bonds. When use is made of a suitable complex-forming substance or a solution in a medium of the complex-forming substance, weak structures of wetting differences on a re-imageable surface having amphiphilic molecules can be developed, that is to say intensified, by using electromagnetic radiation. By the combination of the action of a low radiation output and the wet chemical treatment with the consequence of a selective increase in the contact angle range with respect to water of imaged and non-imaged regions or subareas, a structured lithographic printing form results.

We claim:

1. A method for imaging a lithographic printing form, which comprises the steps of:
    exposing subareas of a surface of the lithographic printing form covered by amphiphilic molecules to electromagnetic radiation, the amphiphilic molecules being adsorbed onto the surface via a hydrophilic molecular region; and
    subsequently treating the subareas with at least one complex-forming substance, resulting in a lithographic printing area structured into hydrophilic and hydrophobic regions being obtained before printing from the lithographic printing form.

2. The method for imaging the lithographic printing form according to claim 1, wherein an action of the complex-forming substance performing at least one of:
    reducing a density of the amphiphilic molecules in the subareas;
    removing the amphiphilic molecules from the subareas; and
    chemically masking the amphiphilic molecules in the subareas.

3. The method for imaging the lithographic printing form according to claim 1, which further comprises during the exposing of the surface step, introducing at least one of a flux of less than or equal to 2 J/cm$^2$ and outputting less than 1000 kW/cm$^2$.

4. The method for imaging the lithographic printing form according to claim 1, which further comprises performing one of:
    providing a polar medium as the complex-forming substance; and
    dissolving the complex-forming substance in the polar medium.

5. The method for imaging the lithographic printing form according to claim 1, wherein the complex-forming substance contains ligands for entering into one or more coordinative bonds with the amphiphilic molecules and/or fragments of the amphiphilic molecules.

6. The method for imaging the lithographic printing form according to claim 1, which further comprises selecting the complex-forming substance from the group consisting of a complex-forming oligosaccharide and a complex-forming polysaccharide.

7. The method for imaging the lithographic printing form according to claim 1, which further comprises providing gum arabic as the complex-forming substance.

8. The method for imaging the lithographic printing form according to claim 1, which further comprises selecting the complex-forming substance from the group consisting of ammonia, citric acid, and a mixture of ammonia and citric acid.

9. The method for imaging the lithographic printing form according to claim 1, which further comprises subjecting the subareas to a weak acid during the treating step with the complex-forming substance.

10. The method for imaging the lithographic printing form according to claim 1, which further comprises using infrared laser radiation as the electromagnetic radiation.

11. The method for imaging the lithographic printing form according to claim 1, wherein the surface that can be covered by the amphiphilic molecules has one of natively oxidized titanium, aluminum, steel, zirconium, magnesium, mixtures of these metals, titanate, and zirconate.

12. The method for imaging the lithographic printing form according to claim 1, which further comprises selecting the amphiphilic molecule from the group consisting of an inorganic acid substituted with one of an aliphatic radical and an aromatic radical and an organic acid substituted with one of the aliphatic radical and the aromatic radical.

13. The method for imaging the lithographic printing form according to claim 12, which further comprises selecting the amphiphilic molecules from the group consisting of a hydroxamic acid, a carbonic acid, and a phosphonic acid.

14. The method for imaging the lithographic printing form according to claim 12, which further comprises providing the aliphatic radical and the aromatic radical with an unsubstituted or substituted carbon chain, a number of carbon atoms being greater than or equal to 6 and less than or equal to 25.

15. A method for imaging a lithographic printing form, which comprises the steps of:
    exposing subareas of a surface of the lithographic printing form covered by amphiphilic molecules to electromagnetic radiation, the amphiphilic molecules being adsorbed onto the surface via a hydrophilic molecular region and the hydrophobic side of the amphiphilic molecules facing away from the surface; and
    subsequently acting on the exposed subareas with at least one complex-forming substance, resulting in a lithographic printing area structured into hydrophilic and hydrophobic regions being obtained before printing from the lithographic printing form.

16. The method for imaging the lithographic printing form according to claim 15, wherein an action of the complex-forming substance performing at least one of:

reducing a density of the amphiphilic molecules in the subareas;

removing the amphiphilic molecules from the subareas; and chemically masking the amphiphilic molecules in the subareas.

\* \* \* \* \*